(12) United States Patent
Kang et al.

(10) Patent No.: US 8,257,993 B2
(45) Date of Patent: Sep. 4, 2012

(54) LIGHT EMITTING DEVICE AND METHOD OF FABRICATING THE SAME

(75) Inventors: Dae Sung Kang, Gwangju (KR); Hyo Kun Son, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 471 days.

(21) Appl. No.: 12/145,320

(22) Filed: Jun. 24, 2008

(65) Prior Publication Data

US 2008/0315224 A1    Dec. 25, 2008

(30) Foreign Application Priority Data

Jun. 25, 2007   (KR) ........................ 10-2007-0062005

(51) Int. Cl.
*H01L 21/205*   (2006.01)
*H01L 33/08*    (2010.01)

(52) U.S. Cl. ................... 438/47; 438/46; 257/E21.085; 257/E21.108

(58) Field of Classification Search .................. 257/14, 257/15, 79–103, E21.085, E21.108; 438/22–47, 438/478–509
See application file for complete search history.

(56) References Cited

U.S. PATENT DOCUMENTS

| | | | | |
|---|---|---|---|---|
| 6,165,812 | A * | 12/2000 | Ishibashi et al. | 438/46 |
| 6,555,846 | B1 * | 4/2003 | Watanabe et al. | 257/94 |
| 6,865,201 | B2 * | 3/2005 | Ito et al. | 372/45.01 |
| 7,646,027 | B2 * | 1/2010 | Bandoh | 257/79 |
| 7,727,873 | B2 * | 6/2010 | Sato et al. | 438/604 |
| 2002/0179923 | A1 * | 12/2002 | Morita et al. | 257/103 |
| 2006/0108528 | A1 * | 5/2006 | Qiu | 250/338.4 |
| 2006/0169990 | A1 * | 8/2006 | Taki et al. | 257/79 |
| 2008/0012002 | A1 * | 1/2008 | Sakong et al. | 257/13 |
| 2009/0166668 | A1 * | 7/2009 | Shakuda | 257/103 |

FOREIGN PATENT DOCUMENTS

WO    WO 2006022497 A1 *  3/2006

OTHER PUBLICATIONS

Japanese Patent Application Publication No. 2007-150066A.*

* cited by examiner

*Primary Examiner* — Kiesha Bryant
*Assistant Examiner* — Eric Ward
(74) *Attorney, Agent, or Firm* — Birch, Stewart, Kolasch & Birch, LLP

(57) ABSTRACT

Provided are a light emitting device and a method of fabricating the same. The light emitting device comprises: a first conductive semiconductor layer; an active layer comprising an InGaN well layer and a GaN barrier layer on the first conductive semiconductor layer; and a second conductive semiconductor layer on the active layer. The GaN barrier layer comprises an AlGaN layer.

8 Claims, 5 Drawing Sheets

LIGHT EMITTING DEVICE AND METHOD OF FABRICATING THE SAME

CROSS-REFERENCE TO RELATED APPLICATIONS

The present application claims priority under 35 U.S.C. 119 and 35 U.S.C. 365 to Korean Patent Application No. 10-2007-0062005 (filed on Jun. 25, 2007), which is hereby incorporated by reference in its entirety.

BACKGROUND

Embodiments relate to a light emitting device and a method of fabricating the same.

A light emitting diode is generally used as a light emitting device.

In the light emitting diode, an N-type semiconductor layer, an active layer, and a P-type semiconductor layer are stacked. Thus, light is generated in the active layer and then is emitted to the outside according to applied power supply.

SUMMARY

Embodiments provide a light emitting device and a method of fabricating the same.

Embodiments also provide a light emitting device with improved light emitting efficiency and electrical characteristic and a method of fabricating the same.

In an embodiment, a light emitting device comprises: a first conductive semiconductor layer; an active layer on the first conductive semiconductor layer; and a second conductive semiconductor layer on the active layer. The active layer comprises an InGaN well layer, a first GaN barrier layer on the InGaN well layer, an AlGaN layer on the first GaN barrier layer, and a second GaN barrier layer on the AlGaN layer.

In an embodiment, a light emitting device comprises: a first conductive semiconductor layer; an active layer comprising an InGaN well layer and a GaN barrier layer on the first conductive semiconductor layer; and a second conductive semiconductor layer on the active layer. The GaN barrier layer comprises an AlGaN layer.

In an embodiment, a method of fabricating a light emitting device comprises: forming a first conductive semiconductor layer; forming an active layer on the first conductive semiconductor layer; and forming a second conductive semiconductor layer on the active layer. The forming of the active layer comprises: forming an InGaN well layer on the first conductive semiconductor layer; forming a first GaN barrier layer on the InGaN well layer; forming an AlGaN layer on the first GaN barrier layer; and forming a second GaN barrier layer on the AlGaN layer.

The details of one or more embodiments are set forth in the accompanying drawings and the description below. Other features will be apparent from the description and drawings, and from the claims.

DETAILED DESCRIPTION OF THE EMBODIMENTS

In the following description, it will be understood that when a layer (or film) is referred to as being 'on/under' another layer or substrate, it can be directly on/under the another layer or substrate, or intervening layers may also be present.

Hereinafter, a light emitting device and a method of fabricating the same will be described with reference to the accompanying drawings.

Figure 1:
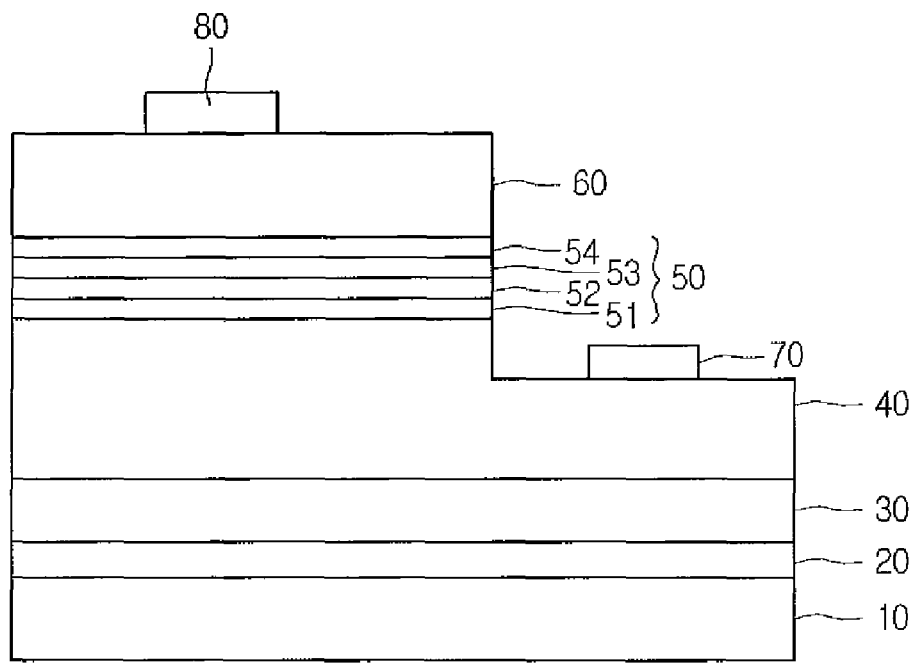
FIG. 1 is a cross-sectional view of a light emitting device according to a first embodiment.

FIG. 1 is a cross-sectional view of a light emitting device according to a first embodiment.

Referring to FIG. 1, the light emitting device of the present invention includes a substrate 10, a buffer layer 20 formed on the substrate 10, an un-doped GaN layer 30 formed on the buffer layer 20, a first conductive semiconductor layer 40 formed on the un-doped GaN layer 30, an active layer 50 formed on the first conductive semiconductor layer 40, a second conductive semiconductor layer 60 formed on the active layer 50, and a first electrode layer 70 and a second electrode layer 80 formed on the first conductive semiconductor layer 40 and the second conductive semiconductor layer 60, respectively.

Additionally, the active layer 50 includes an InGaN well layer 51, a first GaN barrier layer 52 formed on the InGaN well layer 51, an AlGaN layer 53 formed on the first GaN barrier layer 52, and a second GaN barrier layer 54 formed on the AlGaN layer 53.

The AlGaN layer 53 may grow with a thickness of one to three mono layers. That is, the AlGaN layer 53 may grow with a thickness of 5.18 Å to 15.54 Å.

In the light emitting device of the first embodiment, the active layer 50 is used for preventing a leakage current and forming a high quality barrier layer through the AlGaN layer 53 between the first GaN barrier layer 52 and the second GaN barrier layer 54.

Especially, the second GaN barrier layer 54 is formed at a temperature of 850° C. to 1100° C., which is higher than a temperature at which the first GaN barrier layer 52 is formed.

Accordingly, the second GaN barrier layer 54 may be formed of a high quality thin layer and a pit causing a leakage current may be removed, such that electrical characteristics can be improved.

Figure 2:
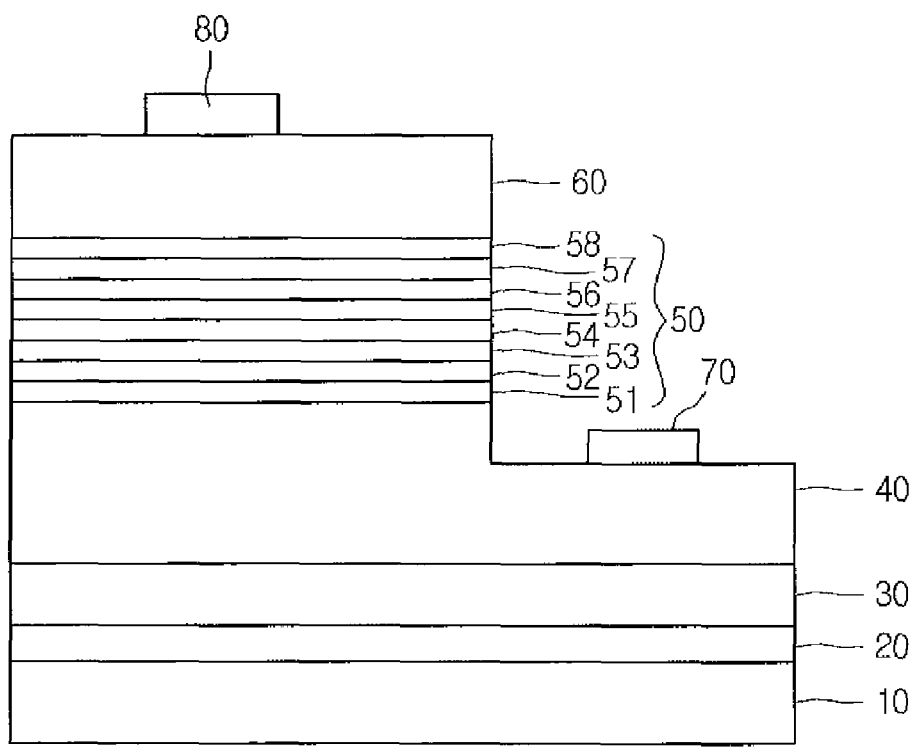
FIG. 2 is a cross-sectional view of a light emitting device according to a second embodiment.

FIG. 2 is a cross-sectional view of a light emitting device according to a second embodiment.

Referring to FIG. 2, only the different contents between FIG. 2 and FIG. 1 will be described.

In the light limiting device of the second embodiment, an active layer 50 includes an InGaN well layer 51, a first GaN barrier layer 52 formed on the InGaN well layer 51, an AlGaN layer 53 formed on the first GaN barrier layer 52, and a second GaN barrier layer 54 formed on the AlGaN layer 53, all of which constitute one period.

Moreover, the active layer 50 includes an InGaN well layer 55 formed on the second GaN barrier layer 54, a first GaN barrier layer 56 formed on the InGaN well layer 55, an AlGaN layer 57 formed on the first GaN barrier layer 56, and a second GaN barrier layer 58 formed on the AlGaN layer 57, all of which constitute another period.

Although not illustrated, the active layer 50 includes a plurality of periods, such that a plurality of well layers, first barrier layers, AlGaN layers, and second barrier layers can be repeatedly formed.

That is, the active layer 50 may have a multi quantum well structure.

FIGS. 3 to 8 are cross-sectional views illustrating a method of fabricating a light emitting device according to an embodiment.

Figure 3:
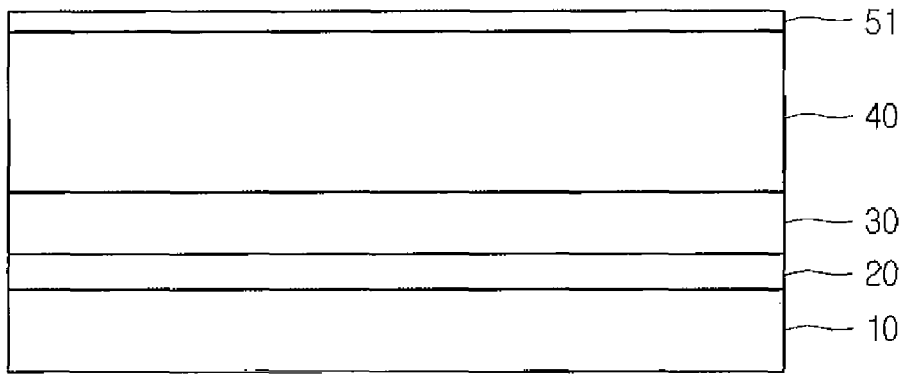
FIGS. 3 to 8 are cross-sectional views illustrating a method of fabricating a light emitting device according to an embodiment.

Referring to FIG. 3, a substrate 10 is prepared, and then a buffer layer 20, an un-doped GaN layer 30, a first conductive semiconductor layer 40, and an InGaN well layer 51 are sequentially formed on the substrate 10.

The substrate 10 may be formed of at least one of sapphire (Al2O3), Si, SiC, GaAs, ZnO, or MgO, and the buffer layer 20 may be formed of at least one of an AlInN/GaN multilayer structure, an InxGa1−xN/GaN multilayer structure, or an AlxInyGa1−(x+y)N/InxGa1−xN/GaN multilayer structure.

The un-doped GaN layer 30 is formed with a supply of TMGa and NH3. At this point, N2 and H2 may be used as a purge gas and a carrier gas.

The first conductive semiconductor layer 40 may be formed of a Si—In co-doped GaN layer doped with silicon and indium simultaneously, and is an N-type semiconductor layer.

Figure 9:
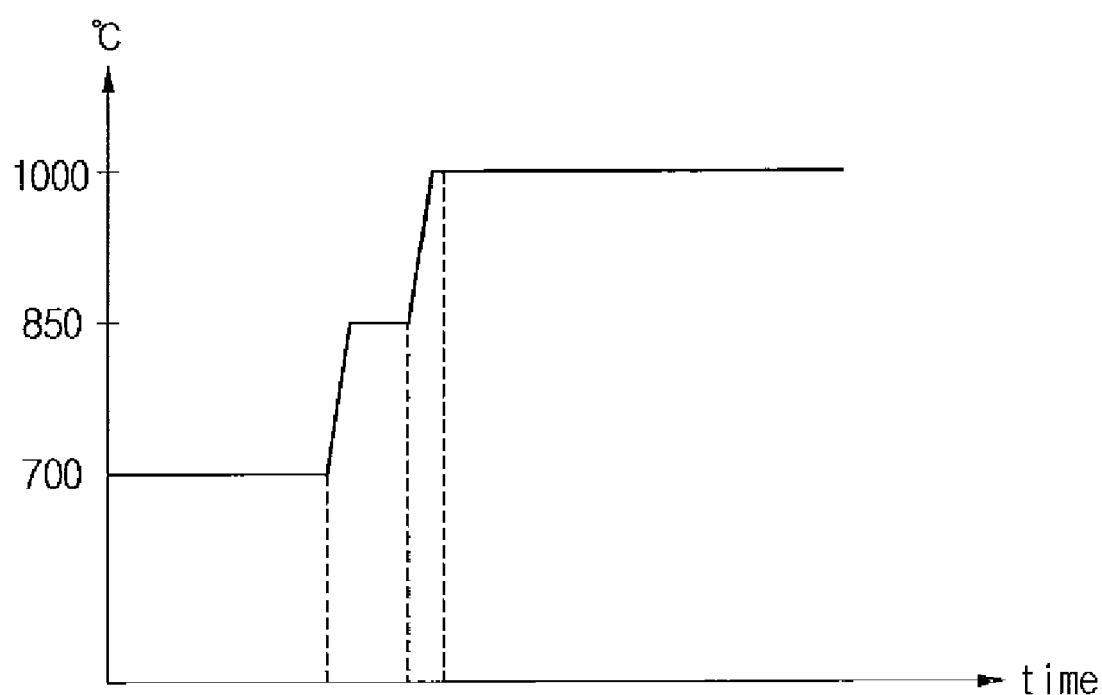
FIG. 9 is a graph illustrating temperature change and injection gas during the forming of an active layer in a method of fabricating a light emitting device according to an embodiment.
Figure 9:
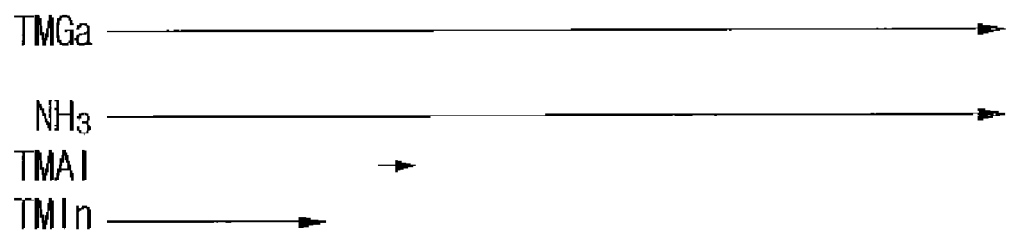

The InGaN well layer 51 is formed with a supply of NH3, TMGa, and TMIn at a temperature of 650° C. to 850° C. In the embodiment of FIG. 9, the InGaN well layer 51 is formed at a temperature of 700° C.

Figure 4:
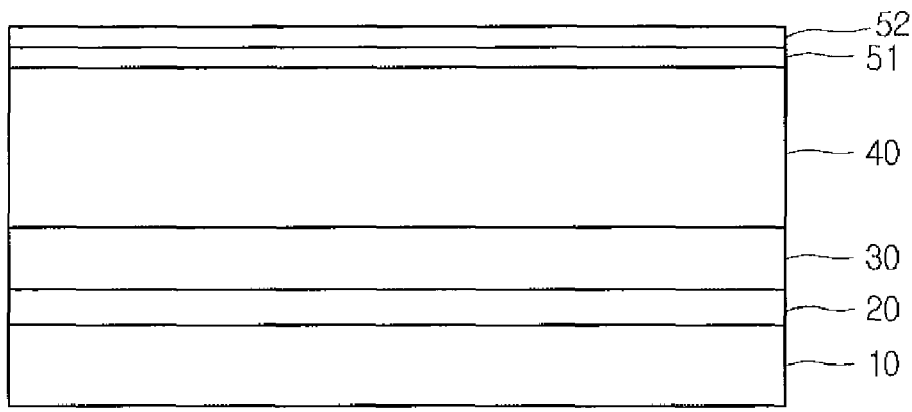

Referring to FIG. 4, the first GaN barrier layer 52 is formed on the InGaN well layer 51.

After the forming the InGaN well layer 51, the first GaN barrier layer 52 is formed with a supply of NH3 and TMGa at a temperature of 800° C. to 1000° C. by drastically increasing a temperature by 150° C. with a ratio of 2° C./sec. In the embodiment of FIG. 9, the first GaN barrier layer 52 is formed by increasing temperature from 700° C. to 850° C.

Figure 5:
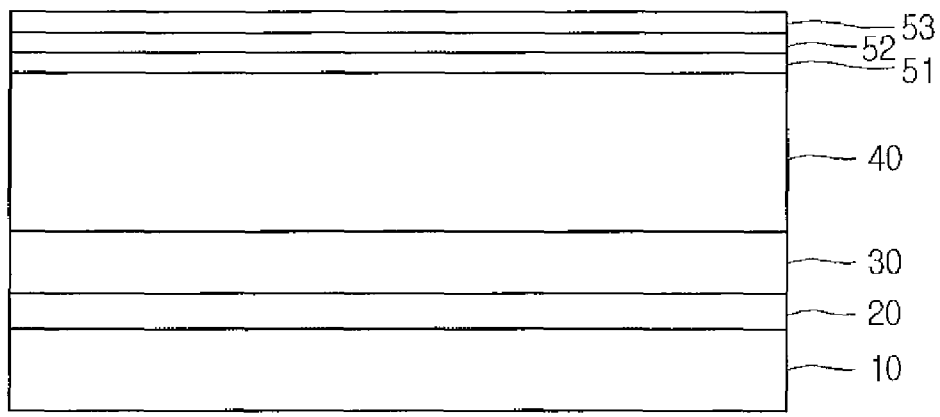

Referring to FIG. 5, an AlGaN layer 53 is formed on the first GaN barrier layer 52.

The AlGaN layer 53 is formed with a supply of NH3, TMGa, and TMAl at a temperature of 800° C. to 1000° C. The AlGaN layer 53 may grow with a thickness of 5.18 Å to 15.54 Å. In the embodiment of FIG. 9, the AlGaN layer 53 is formed at a temperature of 850 Å.

Figure 6:
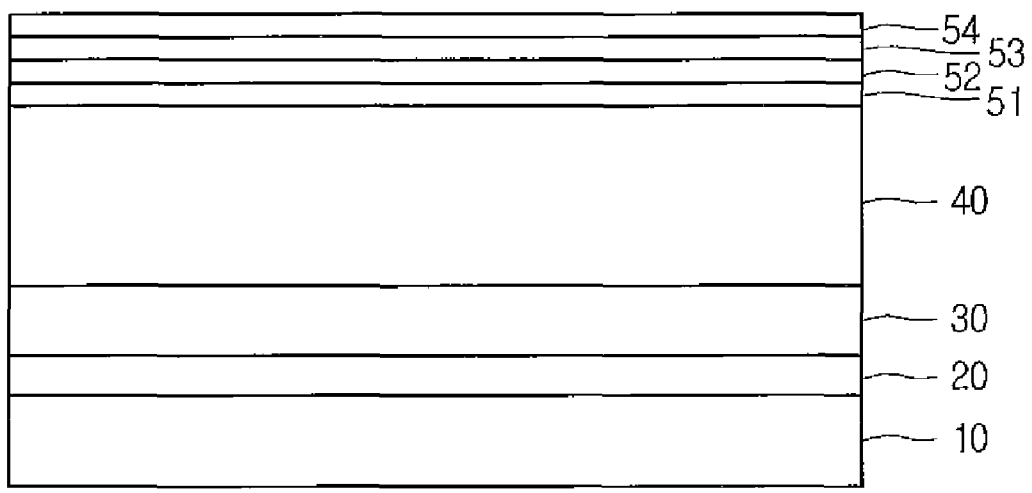

Referring to FIG. 6, a second GaN barrier layer 54 is formed on the AlGaN layer 53.

After the forming the AlGaN layer 53, the second GaN barrier layer 54 is formed with a supply of NH3 and TMGa at a temperature of 850° C. to 1100° C. by drastically increasing temperature by about 150° C. at a ratio of 2° C./sec. In an embodiment of FIG. 9, the second GaN barrier layer 54 is formed by increasing temperature from 850° C. to 1000° C.

The AlGaN layer 53 has durability against high temperature. Accordingly, the second GaN barrier layer 54 can be formed at a temperature that is higher than a temperature at which the first GaN barrier layer 52 is formed. Accordingly, the quality of the second GaN barrier layer 54 can be improved such that pits (which may be formed on the second GaN barrier layer 54) are decreases.

The AlGaN layer 53 includes Al of 10% to 50%. That is, the AlGaN layer 53 may be expressed as AlxGa1−xN ($0.1 \leq x \leq 0.5$).

Figure 7:
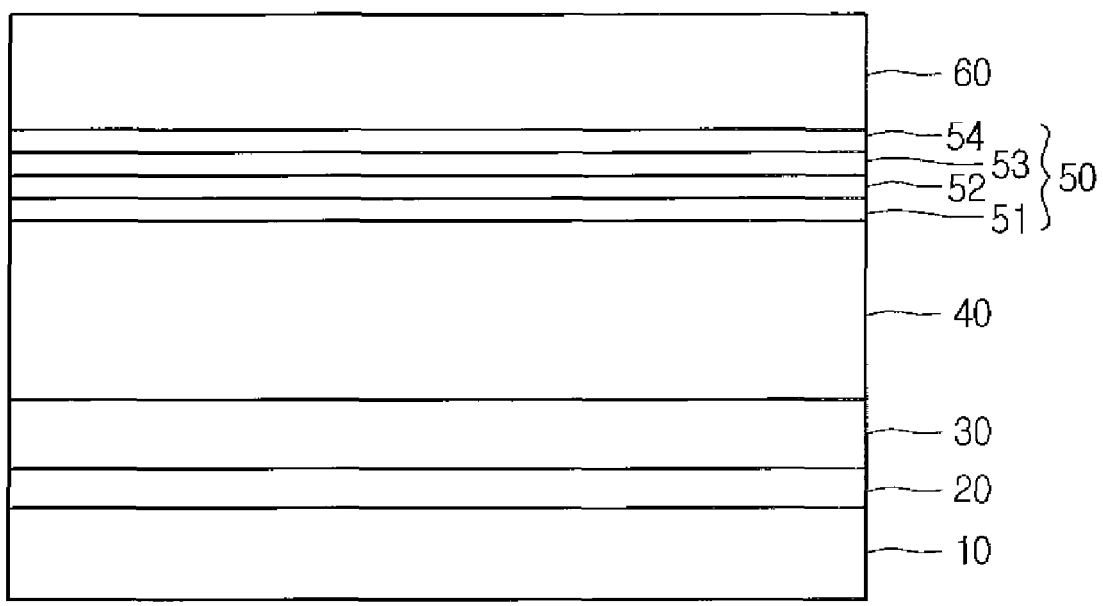

On the other hand, the NH3 and TMGa are continuously supplied to protect the surface of the InGaN well layer 51 during the forming of an active layer 50 of FIG. 7.

Referring to FIG. 7, a second conductive semiconductor layer 60 is formed on the second GaN barrier layer 54.

The second conductive semiconductor layer 60 may be formed of a GaN layer doped with Mg, and is a P-type semiconductor layer.

Figure 8:
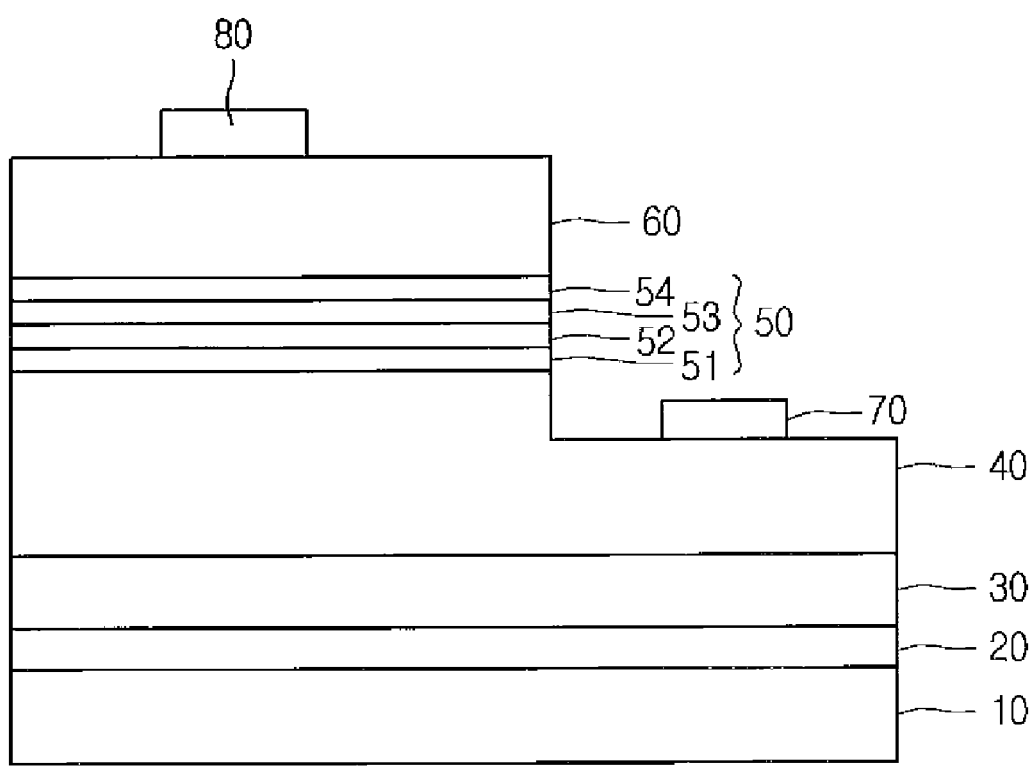

Referring to FIG. 8, the second conductive semiconductor layer 60, the active layer 50, and the first conductive semiconductor layer 40 are partially removed.

Furthermore, a first electrode layer 70 is formed on the first conductive semiconductor layer 40, and a second electrode layer 80 is formed on the second conductive semiconductor layer 60.

In the above light emitting device, the active layer 50 emits light when power supply is applied to the first electrode layer 70 and the second electrode layer 80.

On the other hand, the light emitting device of the embodiment includes the active layer 50 having a structure of the InGaN well layer 51, the first GaN barrier layer 52, the AlGaN layer 53, and the second GAN barrier layer 54. Additionally, since the quality of the second GaN barrier layer is excellent, electrostatic discharge (ESD) and breakdown voltage characteristics are outstanding.

Embodiments provide a light emitting device and a method of fabricating the same. Furthermore, provided is a light emitting device with improved light emitting efficiency and electrical characteristics and a method of fabricating the same.

Although a lateral type light emitting device (in which two electrodes are arranged in the top direction of a semiconductor layer) is described in the above embodiments, the embodiments may be applied to a vertical type light emitting device (in which two electrodes are disposed at the top and bottom directions of a semiconductor layer).

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of fabricating a light emitting device, the method comprising:
   forming a first conductive semiconductor layer;
   forming an active layer on the first conductive semiconductor layer; and
   forming a second conductive semiconductor layer on the active layer,
   wherein the forming of the active layer comprises:
      forming an InGaN well layer on the first conductive semiconductor layer at a first temperature;

forming a first GaN barrier layer on the InGaN well layer by increasing a temperature from the first temperature to a second temperature that is higher than the first temperature;

forming an AlGaN layer on the first GaN barrier layer at the second temperature; and forming a second GaN barrier layer on the AlGaN layer by increasing a temperature from the second temperature to a third temperature that is higher than the second temperature, wherein the active layer comprises a plurality of structures, each of the plurality of structures having sequentially and directly stacked InGaN well layer, first GaN barrier layer, AlGaN layer, and second GaN barrier layer.

2. The method according to claim 1, wherein the second GaN barrier layer is formed at a temperature higher than a temperature at which the first GaN barrier layer is formed.

3. The method according to claim 1, wherein the InGaN well layer is formed with a supply of $NH_3$, TMGa, and TMIn at a temperature of 650° C. to 850° C.

4. The method according to claim 1, wherein after the forming the InGaN well layer, the first GaN barrier layer is formed with a supply of $NH_3$ and TMGa at an increased temperature of 800° C. to 1000° C.

5. The method according to claim 1, wherein the AlGaN layer is formed with a supply of $NH_3$, TMGa, and TMAl at a temperature of 800° C. to 1000° C.

6. The method according to claim 1, wherein after the forming the AlGaN layer, the second GaN barrier layer is formed with a supply of $NH_3$ and TMGa at an increased temperature of 850° C. to 1100° C.

7. The method according to claim 1, wherein the AlGaN layer is expressed as $Al_xGa_{1-x}N$ ($0.1 \leq x \leq 0.5$).

8. The method according to claim 1, wherein $NH_3$ and TMGa are continuously supplied during the forming of the active layer.

* * * * *